(12) United States Patent
Kawamura

(10) Patent No.: US 6,359,428 B1
(45) Date of Patent: Mar. 19, 2002

(54) SEMICONDUCTOR INTEGRATED CIRCUIT DEVICE HAVING AN OUTPUT VOLTAGE SETTING FUNCTION

(75) Inventor: Akinobu Kawamura, Kyoto (JP)

(73) Assignee: Rohm Co. Ltd., Kyoto (JP)

( * ) Notice: Subject to any disclaimer, the term of this patent is extended or adjusted under 35 U.S.C. 154(b) by 0 days.

(21) Appl. No.: 09/605,055

(22) Filed: Jun. 28, 2000

(30) Foreign Application Priority Data

Jul. 2, 1999 (JP) .......................................... 11-188342

(51) Int. Cl.[7] ............................ H03H 1/00; H01H 37/76
(52) U.S. Cl. ...................................... 323/369; 327/525
(58) Field of Search ................................. 323/268–273, 323/364, 369; 327/403, 404, 525, 526

(56) References Cited

U.S. PATENT DOCUMENTS 4,799,043 A * 1/1989 Ueda .......................... 340/825
5,838,076 A * 11/1998 Zarrabian et al. ............ 307/115
6,130,571 A * 10/2000 Yamamoto ................... 327/525

* cited by examiner

Primary Examiner—Matthew Nguyen
(74) Attorney, Agent, or Firm—Arent Fox Kintner Plotkin & Kahn, PLLC

(57) ABSTRACT

A voltage output device outputs an analog voltage obtained by dividing a supply voltage with a plurality of resistor elements. The resistor elements are individually connected in parallel with fuse elements and switching transistors. The fuse elements have a resistance sufficiently lower than the resistor elements. The voltage output device also has a controller that controls, in accordance with an input signal fed thereto, the on/off states of the switching elements. The fuse elements connected in parallel with the transistors that are turned on remain intact without blowing, and the fuse elements connected in parallel with the transistors that are kept off blow. The fuse elements blow when a current higher than a predetermined value is passed therethrough, and this permits adjustment of the value of the output analog voltage.

7 Claims, 3 Drawing Sheets

US 6,359,428 B1

SEMICONDUCTOR INTEGRATED CIRCUIT DEVICE HAVING AN OUTPUT VOLTAGE SETTING FUNCTION

BACKGROUND OF THE INVENTION

1. Field of the Invention

The present invention relates to a voltage output device for outputting an analog voltage, for example for use as a reference voltage, of which the value is adjustable.

2. Description of the Prior Art

FIG. 3 shows a conventional voltage output device that outputs a voltage of which the value is adjustable. In FIG. 3, reference symbols R-0, R-1, R-2, ..., R-i, R-(i+1), ..., R-(n−1), R-n, and R-(n+1) represent resistor elements that have a high resistance, and reference symbols H-1, H-2, ..., H-i, H-(i+1), ..., H-(n−1), and H-n represent fuse elements that have a sufficiently low resistance relative to the resistance of the resistor elements R-0 to R-(n+1) and that blow when a current higher than a predetermined value is passed therethrough for a duration longer than a predetermined time period.

The resistor elements R-0, R-1, R-2, ..., R-i, R-(i+1), ..., R-(n−1), R-n, and R-(n+1) are connected in series between a supply voltage $V_{DD}$ and ground GND. Here, the resistor elements R-0, R-1, R-2, ..., R-i, R-(i+1), ..., R-(n−1), R-n, and R-(n+1) are arranged in the order named from the supply voltage $V_{DD}$ side. The node between the resistor elements R-i and R-(i+1) is connected to an output pad P-OUT.

The fuse elements H-1, H-2, ..., H-i, H-(i+1), ..., H-(n−1), and H-n are connected in parallel with the resistor elements R-1, R-2, ..., R-i, R-(i+1), ..., R(n−1), and R-n, respectively.

The supply voltage $V_{DD}$ side ends of the individual fuse elements H-1, H-2, ..., H-i, H-(i+1), ..., H-(n−1), and H-n are connected to pads P-1, P-2, P-3, ..., P-i, P-(i+1), ..., P-(n−1), and P-n, respectively, and the ground voltage GND side end of the fuse element H-n is connected to a pad P-(n+1).

In this circuit configuration, at the output pad P-OUT a voltage is obtained as a result of the supply voltage $V_{DD}$ being divided by the resistor elements R-0 to R-(n+1). As long as the fuse element H-k (where k=1, 2, ..., n) is not blown, since the fuse element H-k has a lowe resistance, the resistor element R-k remains in a short-circuited state. By contrast, when the fuse element H-k is blown, the resistor element R-k is released from the short-circuited state, and thus a change occurs in the voltage division ratio in which the supply voltage $V_{DD}$ is divided.

When a predetermined voltage is applied between the pads P-k and P-(k+1), a predetermined current flows through the fuse element H-k, and thus the fuse element H-k blows. Accordingly, by applying the predetermined voltage between two appropriate pads, it is possible to adjust the output voltage to a desired value.

However, in this conventional voltage output device, it is necessary to provide as many pads for blowing fuse elements as the number of fuse elements plus one, and this requires that the chip area be made larger in proportion to the number of fuse elements. Moreover, to permit adjustment of the output voltage after packaging, the individual pads for blowing fuse elements need to connected to pins. Thus, it is necessary to additionally provide as many pins as the number of fuse elements plus one, and this requires that the number of pins be increased in proportion to the number of fuse elements.

SUMMARY OF THE INVENTION

An object of the present invention is to provide a voltage output device that requires minimal chip area and a minimal number of pins.

To achieve the above object, according to the present invention, a voltage output device is provided. The device outputs an analog voltage obtained by dividing a supply voltage with a plurality of resistor elements. The device includes fuse elements, which are blowable when a current higher than a predetermined value is passed therethrough and having resistance sufficiently lower than the resistor elements. The fuse elements are connected in parallel with the resistor elements. The device is formed as an integrated circuit device that permits particular ones of those fuse elements to be blown to adjust the output analog voltage. The device is further provided with switching elements connected in parallel with the fuse elements and control means that controls, in accordance with a signal fed thereto, the on/off states of the switching elements.

This circuit configuration permits the fuse elements to be blown in accordance with a signal fed in from outside, and thus requires only a fixed number of pads for blowing fuse elements irrespective of the number of fuse elements.

BRIEF DESCRIPTION OF THE DRAWINGS

This and other objects and features of the present invention will become clear from the following description, taken in conjunction with the preferred embodiments with reference to the accompanying drawings in which.

DESCRIPTION OF THE PREFERRED EMBODIMENTS

Figure 1:
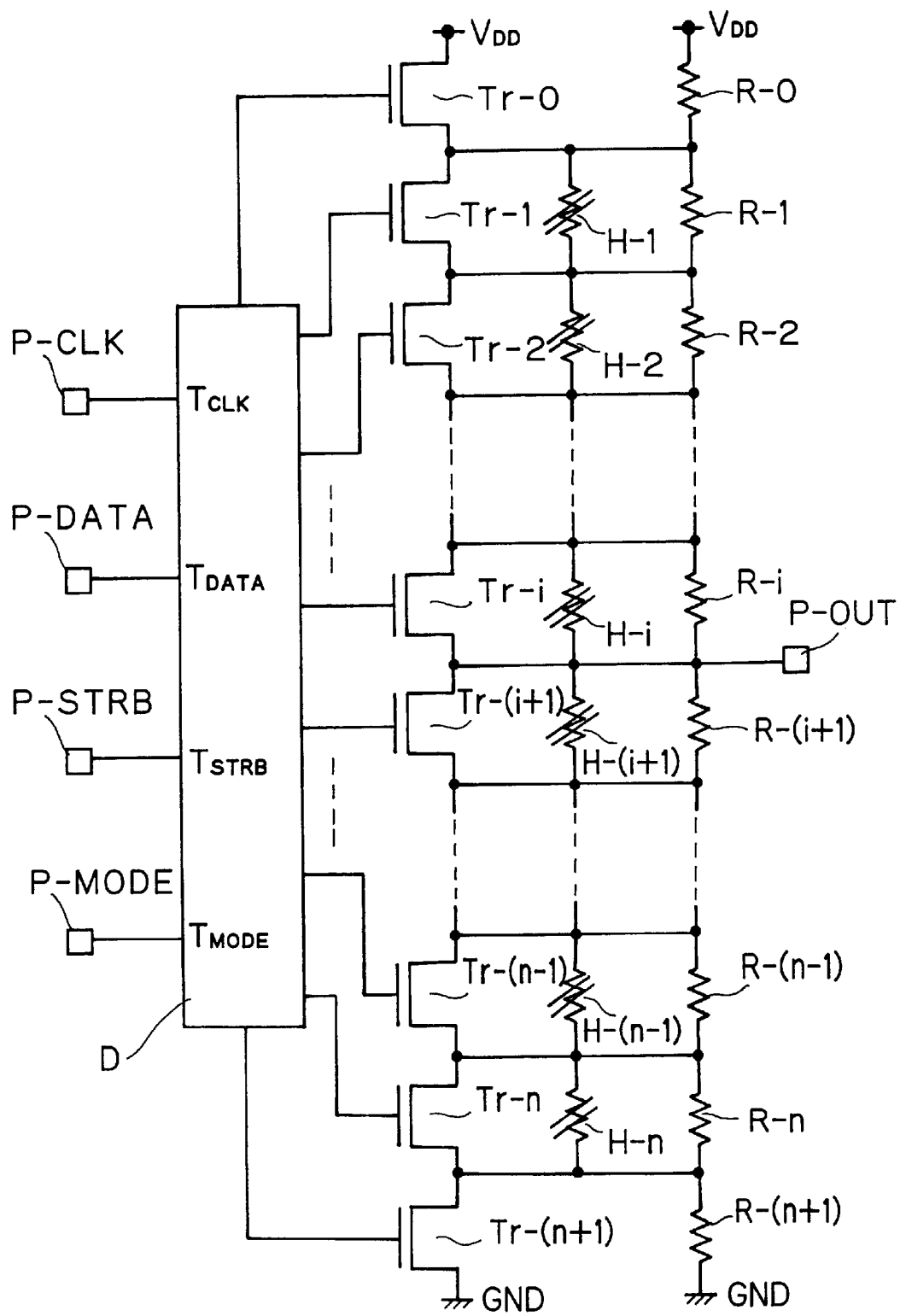
FIG. 1 is a diagram showing the configuration of a voltage output device embodying the invention.
Figure 3:
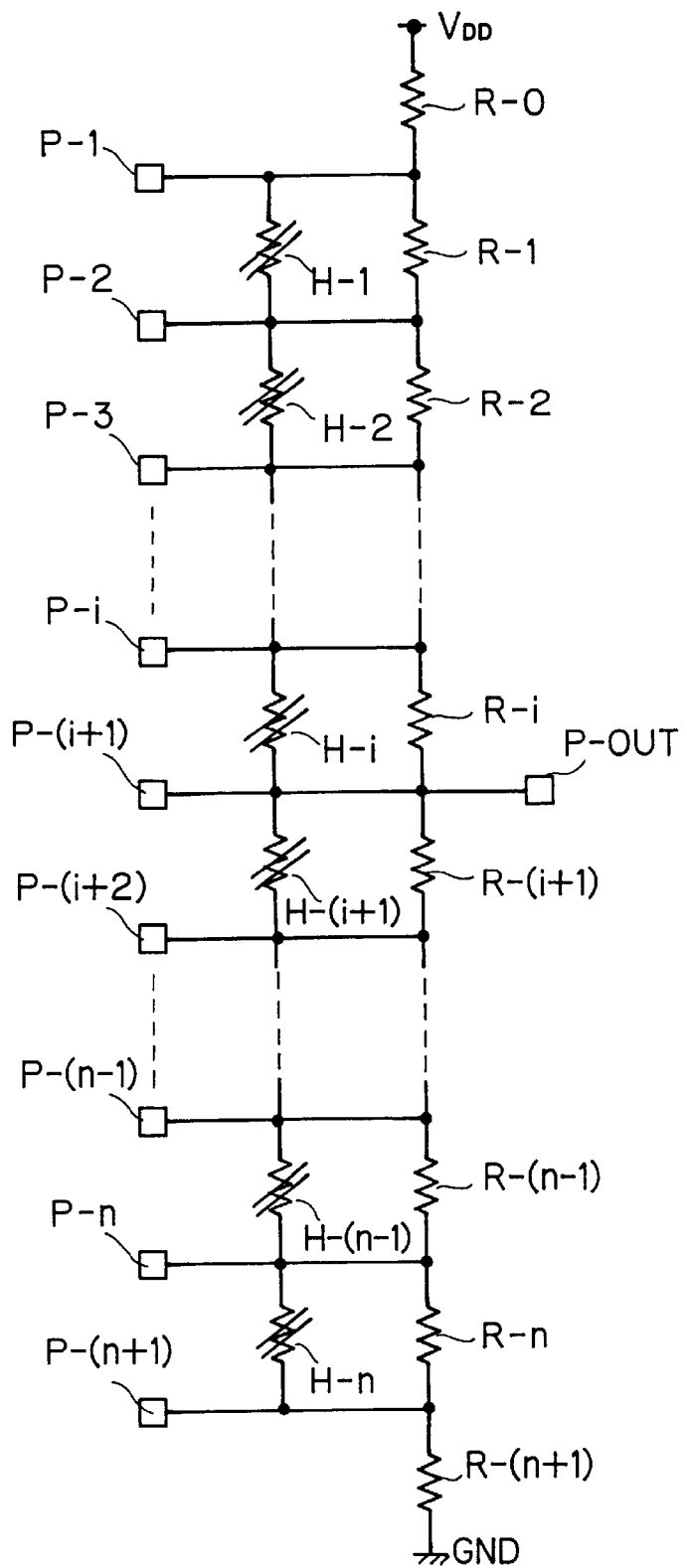
FIG. 3 is a diagram showing the configuration of a conventional voltage output device.

Hereinafter, an embodiment of the present invention will be described with reference to the accompanying drawings. FIG. 1 is a diagram showing the configuration of a voltage output device embodying the invention. Th e voltage output device is formed in a semiconductor integrated circuit device. In this figure, reference symbols Tr-0, Tr-1, Tr-2, ..., Tr-i, Tr-(i+1), ... Tr-(n−1), Tr-n, Tr-(n+1) represent MOS transistors serving as switching elements, and reference symbol D represents a decoder. Here, such elements as are found also in the voltage output device shown in FIG. 3 as a conventional example are identified with the same reference symbols, and their descriptions will not be repeated.

The transistor Tr-k (where k=1, 2, ..., n) is connected in parallel with the fuse element H-k. The transistors Tr-0 and Tr-(n+1) are connected in parallel with the resistor elements R-0 and R-(n+1), respectively.

Here, when the transistors Tr-0 and Tr-(n+1) are off, a current flows, through the resistor elements R-0 and R-(n+1), through the n fuse elements H-1 to H-9 that are connected in series. However, since the resistor elements R-0 and R(n+1) have a high resistance, the current is so low that the fuse elements do not blow.

In this embodiment, only the resistor elements R-0 and R-(n+1) are connected in parallel with transistors alone; however, other resistor elements may also be connected in parallel with transistors alone. The number of resistor elements that are connected in parallel with transistors alone is so determined that, even if a current flows, through those resistor elements, through a plurality of fuse elements connected in series, those fuse elements do not blow.

On the other hand, when the transistors Tr-0 and Tr-(n+1) are turned on, the resistor elements R-0 and R-(n+1) are brought into a short-circuited state, and thus a current flows through the n fuse elements that are connected in series. Here, out of the fuse elements H-1 to H-9, those connected in parallel with transistors that are turned on do not blow because they are kept in a short-circuited state by those transistors, but those connected in parallel with transistors that are kept off blow because a current higher than a predetermined value flows therethrough.

Now, the decoder D will be described. The decoder D has a terminal $T_{CLK}$ for receiving a clock signal CLK, a terminal $T_{DATA}$ for receiving a data signal DATA, a terminal $T_{STRB}$ for receiving a strobe signal STRB, and a terminal $T_{MODE}$ for receiving a mode signal MODE. In accordance with the signals fed in via these terminals, the decoder D controls the on/off states of the individual transistors Tr-0 to Tr-(n+1) by applying appropriate voltages to the gates of the transistors Tr-0 to Tr-(n+1). Here, the clock signal CLK, data signal DATA, strobe signal STRB, and mode signal MODE are each a one-bit digital signal. The data signal DATA is composed of data blocks each corresponding to one of the transistors so that the on/off states of the transistors can be specified individually.

When the mode signal MODE indicates a normal mode (for example, when the mode signal MODE is at a low level), all of the transistors Tr- to Tr-(n+1) are kept off.

On the other hand, when the mode signal MODE indicates a setting mode (for example, when the mode signal MODE is at a high level), the decoder D operates as follows. First, the decoder D reads the data signal DATA in synchronism with the clock signal CLK and stores the data signal DATA. Then, in accordance with the data signal DATA thus stored, the decoder D recognizes which fuse elements to blow, and accordingly turns off all the transistors that are connected in parallel with the fuse elements to be blown and turns on all the transistors that are connected in parallel with the other fuse elements. Then, in synchronism with the strobe signal STRB (for example, at a rising edge, from a low level to a high level, of the strobe signal STRB), the decoder D turns on the transistors Tr-0 and Tr-(n+1).

Figure 2:
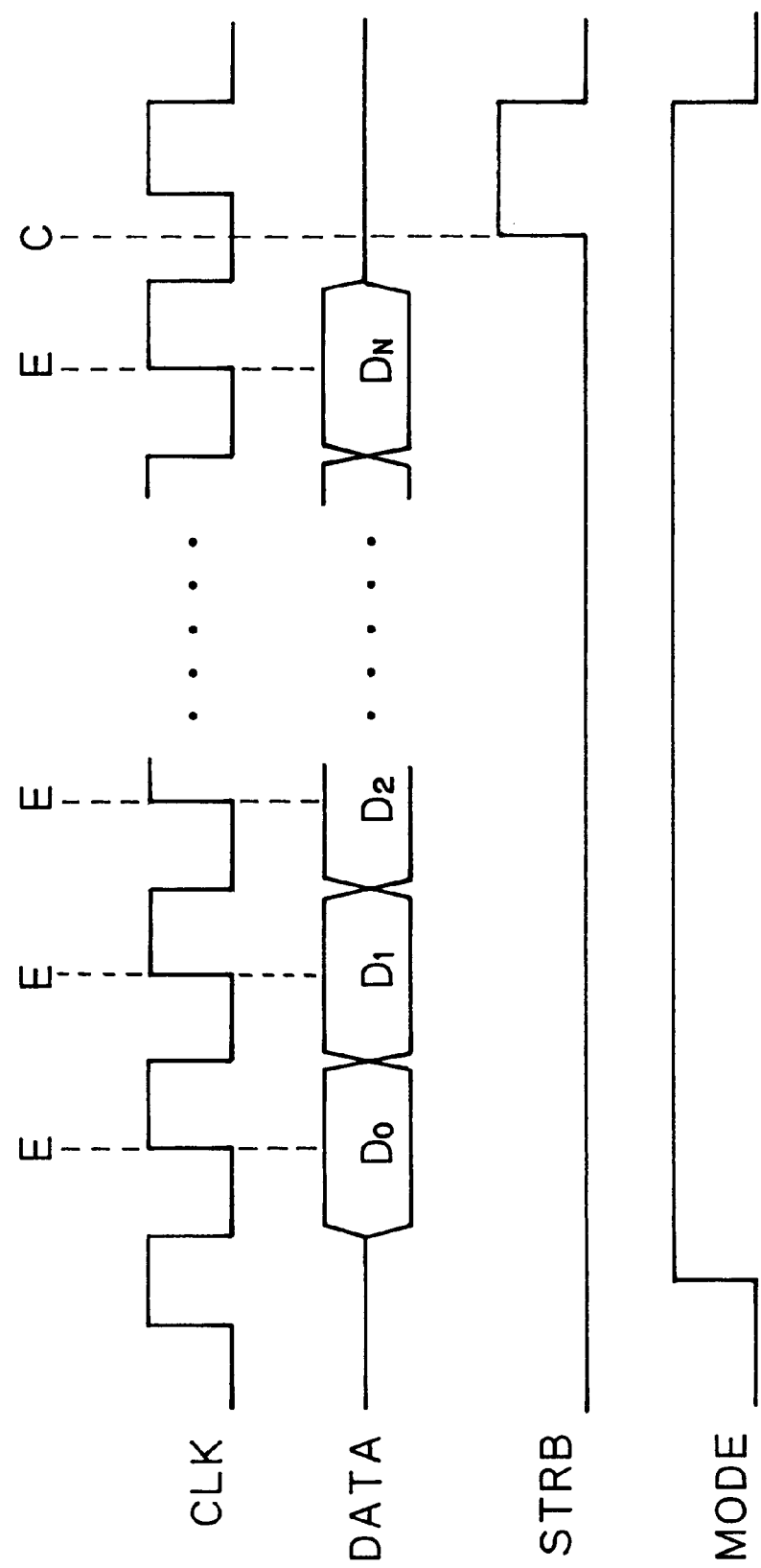
FIG. 2 is a timing chart of the signals fed to the decoder.

In the voltage output device of this embodiment configured as described above, for example when the clock signal CLK, data signal DATA, strobe signal STRB, and mode signal MODE are fed to the decoder D with timing as shown in FIG. 2, then, in synchronism with rising edges (the time points E in FIG. 2) of the clock signal CLK, the data signal DATA, composed of data blocks $D_0, D_1, \ldots, D_N$, is read and stored, and then, by the time point C in FIG. 2, out of the transistors Tr-1 to Tr-n, those connected in parallel with the fuse elements to be blown are turned off and the other transistors are turned on. Then, at the time point C in FIG. 2, the transistors Tr-0 and Tr-(n+1) are turned on, and thus all of the fuse elements to be blown are blown at once. Which fuse elements to blow is recognized in accordance with the data $D_0, D_1, \ldots, D_N$ stored.

Thus, in the voltage output device of this embodiment, by feeding thereto a clock signal CLK, a data signal DATA, a strobe signal STRB, and a mode signal MODE with appropriate timing, and in addition by feeding thereto an appropriate signal as the data signal DATA, it is possible to adjust the output voltage to a desired value.

Now that the fuse elements can be blown in accordance with a signal fed in from outside, it is necessary to provide, as pads for blowing fuse elements, only four pads P-CLK, P-DATA, P-STRB, and P-MODE for receiving four signals CLK, DATA, STRB, and MODE, respectively, to be fed to the decoder D, irrespective of the number of fuse elements. This helps minimize the chip area needed. Moreover, even in cases where adjustment of the output voltage is required after packaging, it is necessary to additionally provide only four pins that are connected to those four pads. This helps minimize the number of pins needed.

In the voltage output device of this embodiment, all fuse elements to be blown are blown at once; however, it is also possible to blow such fuse elements sequentially one after another, for example by first turning on the transistors Tr-0 and Tr-(n+1) with all of the transistors Tr-1 to Tr-n turned on, and then turning off, sequentially one after another, those of the transistors Tr-1 to Tr-n which are connected in parallel with the fuse elements to be blown.

In cases where the number of fuse elements is large, or the supply voltage $V_{DD}$ is low, and therefore, if it is attempted to blow all fuse elements to be blown at once, there is a possibility that the current that is passed through the fuse elements is too low to successfully blow them, it is also possible to check first whether the number of fuse elements to be blown is greater than a threshold value or not so that, if the threshold value is exceeded, all the fuse elements to be blown are blown at once and, otherwise, the fuse elements to be blown are divided into groups each including so many of them as can be blown at once and are then blown sequentially one group at a time.

According to the embodiment described above, it is possible to realize a voltage output device that permits fuse elements to be blown in accordance with a signal fed in from outside and that thus requires only a fixed number of pads for blowing fuse elements irrespective of the number of fuse elements. This helps reduce the chip area and the number of pins required. Moreover, this voltage output device permits fuse elements to be blown even after packaging, and thus allows trimming after mounting. Furthermore, this voltage output device permits, even after the output voltage is adjusted to a particular value once, re-adjustment of the output voltage by the use of fuse elements that have not yet been blown. This helps reduce variation with time.

What is claimed is:

1. A voltage output device comprising:

a plurality of resistor elements for dividing a supply voltage;

an output terminal for delivering a divided voltage;

a plurality of fuse elements connected in parallel with the resistor elements;

a plurality of switching elements connected in parallel with the fuse elements; and a controller for controlling the switching elements in accordance with an input signal fed thereto so as to blow particular ones of the fuse elements connected in parallel with the switching elements.

2. A voltage output device as claimed in claim 1, wherein the fuse elements have a resistance lower than the resistor elements.

3. A voltage output device as claimed in claim 1, wherein the switching elements are each composed of a transistor that receives at a control electrode thereof a control signal from the controller.

4. A voltage output device as claimed in claim 1, wherein the resistor elements are connected in series between the supply voltage and ground, and the resistor element that is connected directly to the supply voltage is connected in parallel with one of the switching elements but with none of the fuse elements.

5. A voltage output device as claimed in claim 4, wherein the resistor element that is connected directly to ground is connected in parallel with one of the switching elements but with none of the fuse elements.

6. A voltage output device as claimed in claim 1, wherein the input signal includes a data signal for specifying whether to turn the individual switching elements on or off and a clock, and the controller outputs the control signal on a basis of data that the controller reads in synchronism with the clock.

7. A voltage output device as claimed in claim 6, wherein the input signal further includes a mode signal, and the controller reads the data while the mode signal is present.

\* \* \* \* \*